United States Patent [19]

Kuki et al.

[11] Patent Number: 4,922,380

[45] Date of Patent: May 1, 1990

[54] JUNCTION BOX CONTAINING A PRINTED CIRCUIT BOARD

[75] Inventors: Heiji Kuki; Naoya Kurimoto, both of Osaka, Japan

[73] Assignees: Sumitomo Wiring Systems, Ltd., Yokkaichi; Sumitomo Electric Industries, Ltd., Osaka, both of Japan

[21] Appl. No.: 234,634

[22] Filed: Aug. 22, 1988

[30] Foreign Application Priority Data

Aug. 20, 1987 [JP] Japan ............................... 62-126837

[51] Int. Cl.[5] ............................................. H05K 1/14

[52] U.S. Cl. ..................................... 361/399; 361/395

[58] Field of Search ............... 361/399, 395; 174/52.4, 174/59, 60

[56] References Cited

U.S. PATENT DOCUMENTS 4,195,194 3/1980 Kuster et al. ......................... 174/59

4,218,724 8/1980 Kaufman ......................... 361/399 X 4,361,371 11/1982 Williams ......................... 361/399 X 4,603,930 8/1986 Ito .................................. 361/399 X 4,626,962 12/1986 Ahn et al. ........................... 361/399

4,630,174 12/1986 Kaufmann II ................. 174/52.4 X 4,703,397 10/1987 Minoura et al. ................ 361/399 X

FOREIGN PATENT DOCUMENTS 60-16110 1/1985 Japan .

*Primary Examiner*—Gerald P. Tolin

*Attorney, Agent, or Firm*—Cushman, Darby & Cushman

[57] ABSTRACT

In a junction box containing a printed circuit board with electrodes having first end portions soldered to the printed circuit board, an electrode containing member is secured to the printed circuit board on the side of the first end portions of the electrodes, and the electrodes are U-shaped and contained in the electrode containing member in such a manner that the other end portions thereof are extended in a connector inserting hole formed in the junction box, whereby the electrodes are prevented from being adversely affected by external force when the junction box is engaged with the mating connector.

10 Claims, 2 Drawing Sheets

JUNCTION BOX CONTAINING A PRINTED CIRCUIT BOARD

BACKGROUND OF THE INVENTION

1. Field of the Invention

This invention relates to an integrated control unit which contains a printed circuit board soldered to electrical elements or the like and connected to an external connector.

2. Prior Art

Integrated control units containing printed circuit boards are well known in the art. An integrated control unit having electrodes soldered to the printed circuit board has been disclosed, for instance, by Japanese Patent Application (OPI) No. 16110/1985 (the term "OPI" as used herein means an "unexamined published application").

In view of manufacture, it is preferable that the electrodes are soldered to the printed circuit board on the same side as the electrical elements or the like. And it is not preferable to allow the electrodes to protrude in the widthwise direction of the integrated control unit, because the total thickness of the integrated control unit is increased as much. For these reasons, it can be considered that U-shaped electrodes are employed so that the electrodes may not be protruded outside the junction box in the widthwise direction. In general, the U-shaped electrodes are extended relatively long. Therefore, when an external force is applied to the connector connecting end portions of the electrodes, stress is exerted on the soldered end portions thereof by leverage, as a result of which the connection may become unsatisfactory or the electrodes may be bent.

SUMMARY OF THE INVENTION

Accordingly, an object of this invention is to eliminate the above-described difficulties accompanying a conventional junction box containing a printed circuit board.

The foregoing object and other objects of the invention have been achieved by the provision of a junction box containing a printed circuit board which comprises a plurality of electrodes each having one end portion soldered to the printed circuit board and the other end portion exposed outside the junction box; in which, according to the invention, the electrodes are U-shaped and accommodated in an electrode containing member, which is secured to the printed circuit board on the side of the one end portion of the electrodes, and the second end portion of the electrodes are extended in a connector inserting hole formed in the junction box.

The nature, principle and utility of the invention will become more apparent from the following detailed description when read in conjunction with the accompanying drawings.

DETAILED DESCRIPTION OF THE INVENTION

One example of a junction box containing a printed circuit board according to this invention will be described with reference to the accompanying drawings.

Figure 1:
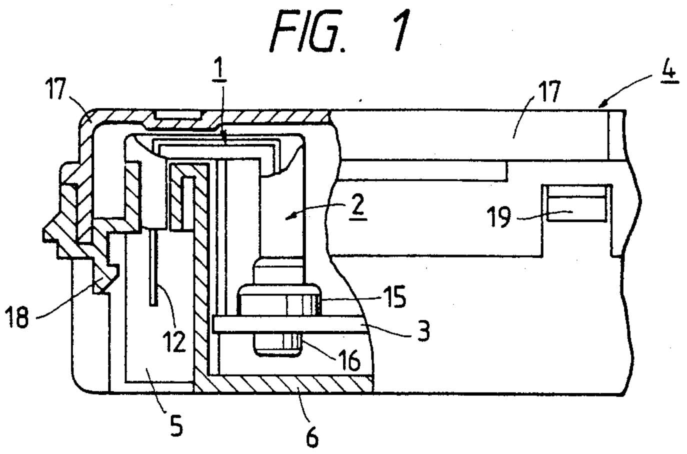
FIG. 1 is a side view, with parts cut away, showing a part of a junction box according to this invention.

As shown in FIG. 1, the junction box 4 of the invention has a printed circuit board 3 built in a lower casing 6. Electrical elements or the like (not shown) are installed on the upper surface of the printed circuit board 3, and lead wires thereof, not shown, protrude on the lower surface of the printed circuit board 3 and are soldered. First end portions of electrodes 1, namely, soldering legs 7 shown in FIG. 2 are inserted into inserting holes 11 shown in FIG. 3 formed in the electrode containing member 2, and soldered.

Figure 2:
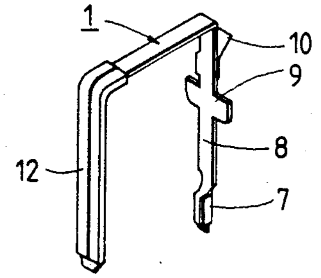
FIG. 2 is a perspective view of an electrode employed in the junction box of the invention.

Each of the electrodes 1 is substantially U-shaped as shown in FIG. 2, and its one end portion is formed into the above-described soldering leg 7. The soldering leg 7 is curved in such a manner that it is semi-circular in cross section and provided with a path. An elongated plate 8 is extended from the soldering leg 7, and a pair of wings 9 protrude from both sides of the elongated plate 8 so as to stably guide the plate 8 while preventing the twisting of the plate 8. The plate 8 further has a locking pawl 10 above the wings 9 which is engaged with an electrode containing member 2. The locking pawl 10 is formed as follows: An ear is extended from one edge of the plate 8 and folded, and the end portion of the ear thus folded is bent forming an angle with the plate 8. The elongated plate 8 is bent substantially horizontally above the ear in such a manner that it is extended to the left in FIG. 1.

The other end portion 12 of the elongated plate 7 is doubly folded to reinforce itself and bent in such a manner that it is parallel with the soldering leg 7.

Figure 3:
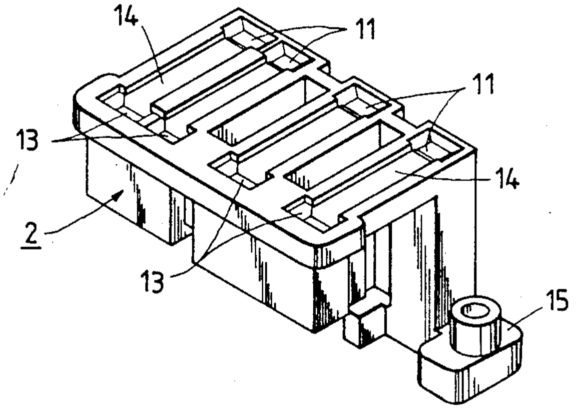
FIGS. 3 and 4 are a perspective view and a plan view showing an electrode containing member in the junction box, respectively.
Figure 4:
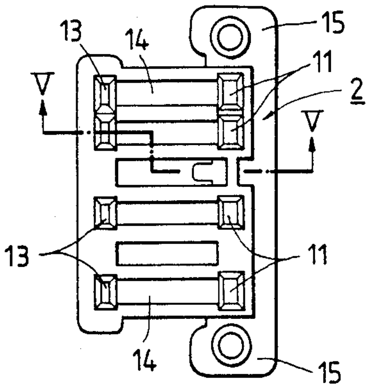
Figure 5:
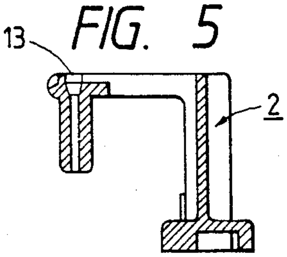
FIG. 5 is a sectional view taken along V—V in FIG. 4.

The electrode containing member 2 is constructed as shown in FIGS. 3 and through 5, into which four electrodes 1 are fixedly inserted in parallel with each other. More specifically, the electrode containing member 2 has the inserting holes 11 into which the soldering legs 7 are inserted (hereinafter referred to as "first inserting holes 11", when applicable) and inserting holes 13 into which the other end portions 12 of the electrodes 1 are inserted and exposed (hereinafter referred to as "second inserting holes 13", when applicable). The upper openings of the first inserting holes 11 are communicated through grooves 14 with the upper openings of the second inserting holes 13, respectively, and the bases of the U-shaped electrodes 1 are fitted in the grooves 14, respectively. The electrode containing member 2 has legs 15 with female-threaded holes, and it is secured to the printed circuit board 3 with screws 16 as shown in FIG. 1.

Figure 6:
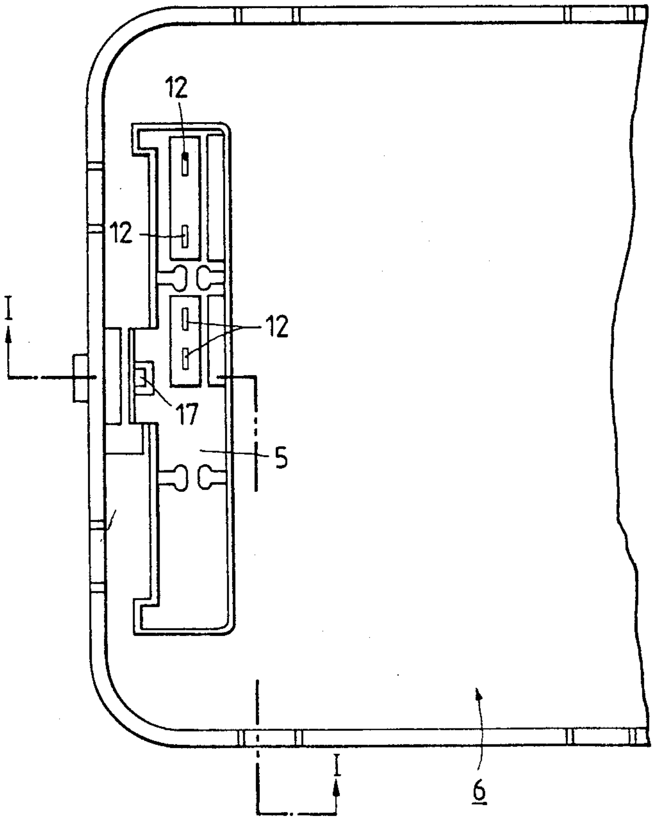
FIG. 6 is a bottom view of a lower casing in the junction box.

The electrode containing member 2 with the electrodes 1 thus coupled to the printed circuit board 3 is engaged with a connector inserting hole 5 formed in the lower casing 6 as shown in FIGS. 1 and 6 in such a manner that the other end portions 12 of the electrodes 1 are exposed and held upright. The connector inserting hole 5 is provided with a locking pawl 18 which is engaged with a mating connector (not shown) when inserted. The mating connector inserted into the connecting inserting hole 5 is electrically connected through the other end portions 12 of the electrodes 1 to the circuit on the printed circuit board 3.

An upper casing 17 is coupled to the lower casing 6 and locked with a locking piece 19. Therefore, the electrode containing member 2 is positively held between the upper and lower casings 17 and 6 as shown in FIG. 1, which prevents the application of an external force to the soldered parts when the connector is engaged with the junction box.

As was described above, in the junction box of the invention, the electrodes are coupled to the electrode containing member adapted to reinforce the electrodes and are then connected to the printed circuit board, and therefore the printed circuit board is prevented from being adversely affected by external forces. Furthermore, in the junction box, the connector inserting hole is provided in the space in the lower casing. Therefore, the junction box can be relatively small in thickness, and the electrodes can be held rationally and simply.

What is claimed is:

1. A junction box containing a printed circuit board, comprising:

at least one U-shaped electrode having a first end portion soldered to said printed circuit board and a second end portion exposed outside said junction box via a hole in a portion of said junction box;

electrode containing means within said junction box and separable therefrom containing and physically contacting and supporting said electrode, said electrode containing means being secured to said printed circuit board on the side of said first end portion of said electrode, said electrode containing means including a surface having at least one groove into which a base of said electrode is fitted;

an inserting hole in said junction box for inserting a connector, said second end portion of said electrode being extended in said inserting hole to couple said second end portion to said connector.

2. A junction box as claimed in claim 1, in which said second end portion of said electrode is doubly folded.

3. A junction box as claimed in claim 1, in which said first end portion of said electrode is formed into a soldering leg having a semi-circular cross section.

4. A junction box as claimed in claim 3, in which said first end portion is provided with a pair of wings which are protruded from both sides of said first end portion.

5. A junction box as claimed in claim 1, in which said first end portion is provided with a locking pawl which is engaged with said electrode containing means.

6. A junction box as claimed in claim 1, in which said electrode containing means has a pair of legs secured to said printed circuit board.

7. A junction box as claimed in claim 1, in which said electrode containing means comprises at least one first inserting hole into which said first end portion of said electrode is inserted, and at least one second inserting hole into which said second end portion thereof is inserted and exposed.

8. A junction box as claimed in claim 7, wherein said first and second inserting holes are located in said groove and are provided with upper openings, respectively, and said upper opening of said first inserting hole is communicated through said groove with said upper opening of said second inserting hole so that the base of said electrode is fitted in said groove.

9. A junction box as claimed in claim 1, in which said inserting hole is provided with a locking pawl which is engaged with said connector.

10. A junction box as claimed in claim 1, further comprising upper and lower cases coupled to each other to positively hold said electric containing member therebetween.

* * * * *